(12) United States Patent
Ng (10) Patent No.: US 7,372,291 B2
(45) Date of Patent: May 13, 2008

(54) CIRCUITS HAVING PRECISION VOLTAGE CLAMPING LEVELS AND METHOD

(75) Inventor: Kian-Ann Ng, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 122 days.

(21) Appl. No.: 11/259,851

(22) Filed: Oct. 26, 2005

(65) Prior Publication Data
US 2007/0075744 A1 Apr. 5, 2007

Related U.S. Application Data

(60) Provisional application No. 60/722,456, filed on Sep. 30, 2005.

(51) Int. Cl.
*H03K 17/16* (2006.01)
*H03K 19/003* (2006.01)
*H03K 19/0175* (2006.01)

(52) U.S. Cl. .............................. 326/21; 326/31; 326/82; 327/108; 327/180

(58) Field of Classification Search .................. 326/21, 326/26, 27, 29–31, 82; 327/112, 170, 180, 327/313
See application file for complete search history.

(56) References Cited

U.S. PATENT DOCUMENTS

| | | | | |
|---|---|---|---|---|
| 5,488,324 A | * | 1/1996 | Mizuta et al. | ............... 327/77 |
| 5,528,190 A | * | 6/1996 | Honnigford | ................. 327/328 |
| 5,585,740 A | * | 12/1996 | Tipon | ............................ 326/26 |
| 5,663,664 A | | 9/1997 | Schnizlein | |
| 5,939,870 A | | 8/1999 | Nguyen | |
| 5,986,489 A | | 11/1999 | Raza et al. | |
| 6,075,379 A | | 6/2000 | Haider et al. | |
| 6,118,261 A | | 9/2000 | Erdelyi et al. | |
| 6,288,563 B1 | * | 9/2001 | Muljono et al. | ............... 326/27 |
| 6,433,622 B1 | | 8/2002 | Anderson et al. | |
| 6,492,686 B1 | * | 12/2002 | Pappert et al. | ............... 257/355 |
| 6,501,292 B1 | * | 12/2002 | Nack | ........................... 326/27 |
| 6,646,483 B2 | | 11/2003 | Shin | |
| 6,704,818 B1 | | 3/2004 | Martin et al. | |
| 6,737,605 B1 | * | 5/2004 | Kern | ..................... 219/121.67 |
| 6,737,905 B1 | * | 5/2004 | Noda et al. | .................. 327/323 |
| 6,744,287 B2 | | 6/2004 | Mooney | |
| 6,760,209 B1 | * | 7/2004 | Sharpe-Geisler | ............ 361/111 |
| 6,847,560 B2 | | 1/2005 | Pan | |
| 6,870,391 B1 | * | 3/2005 | Sharpe-Geisler | ............. 326/37 |
| 7,148,725 B1 | * | 12/2006 | Chan et al. | .................... 326/82 |

(Continued)

*Primary Examiner*—Vibol Tan
*Assistant Examiner*—Dylan White
(74) *Attorney, Agent, or Firm*—Lisa K. Jorgenson; William A. Munck (57) ABSTRACT

A slew rate control circuit includes a receiver for receiving input signals and an output generator for generating output signals based on the input signals. The slew rate control circuit also includes an electrical interconnection coupling an output of the receiver and an input of the output generator. In addition, the slew rate control circuit includes a voltage clamp for clamping a voltage on the electrical interconnection between two known voltage reference levels. The voltage clamp may include a first current source for providing driving capacity to a driver circuit to prevent the voltage on the electrical interconnection from falling below one known voltage reference level. The voltage clamp may also include a second current source and a third current source for providing sinking capacity to the driver circuit to prevent the voltage on the electrical interconnection from rising above the other known voltage reference level.

17 Claims, 5 Drawing Sheets

U.S. PATENT DOCUMENTS

2002/0181180 A1* 12/2002 Ivanov et al. .............. 361/93.9
2003/0090309 A1* 5/2003 Hunt .......................... 327/309
2005/0071706 A1 3/2005 Deshmane

* cited by examiner

CIRCUITS HAVING PRECISION VOLTAGE CLAMPING LEVELS AND METHOD

CROSS-REFERENCE TO RELATED APPLICATIONS

This patent application claims priority under 35 U.S.C. § 119(e) to U.S. Provisional Patent Application No. 60/722,456 entitled "METHOD AND SYSTEM FOR PROVIDING INTEGRATOR-BASED CIRCUITS WITH PRECISION VOLTAGE CLAMPING LEVELS" filed on Sep. 30, 2005, which is hereby incorporated by reference.

TECHNICAL FIELD

This disclosure relates generally to electronic circuitry and more particularly to circuits having precision voltage clamping levels and method.

BACKGROUND

Integrated circuits often include logic devices that receive input signals and provide output signals responsive to the input signals. Output signals from logic devices are often used as input signals to subsequent logic devices. As a result, the output signals often need to have sufficient voltage and current to drive the subsequent logic devices. A common practice is to buffer the output signals using transistors to ensure adequate output signal strength. However, providing each output signal with its own buffer and driver, supplied by a power supply, can create noise problems when many output signals switch state at the same time.

One solution to this problem has involved controlling the slew rate of the output buffers. Slew rate generally refers to the speed at which a voltage or current changes. Controlling the slew rate allows a designer of an integrated circuit to slow the speed of the integrated circuit by driving the output buffers with less current.

Figure 1:
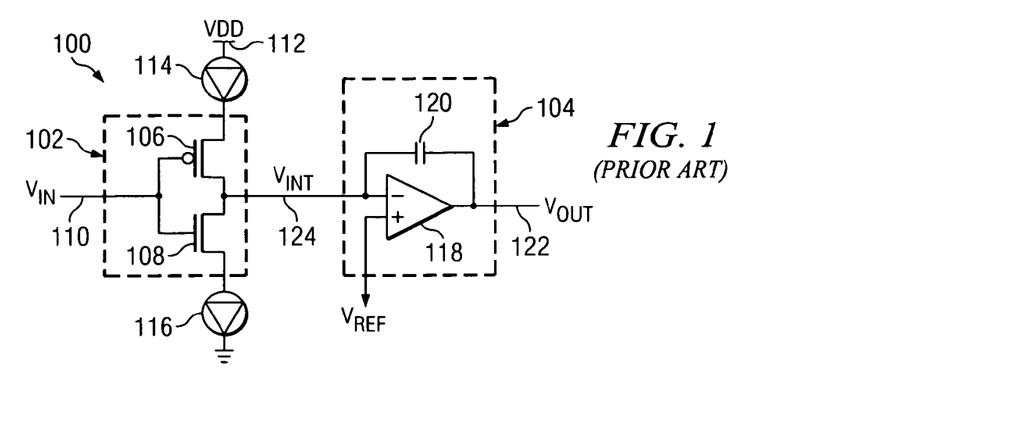
FIG. 1 illustrates a conventional integrator-based slew rate control circuit.

FIG. 1 illustrates a typical integrator-based slew rate control circuit 100. In this example, the slew rate control circuit 100 includes a driver circuit 102 and an integrator 104. The driver circuit 102 includes a P-channel Metal Oxide Semiconductor (MOS) transistor 106 and an N-channel MOS transistor 108. The transistors 106 and 108 represent pull-up and pull-down transistors, respectively. Gate terminals of the transistors 106 and 108 are coupled to an input signal 110. A voltage of the input signal 110 is referred to as an input voltage $V_{IN}$. A drain terminal of the transistor 106 and a drain terminal of the transistor 108 are coupled to the integrator 104. A source terminal of the transistor 106 is coupled to a power supply voltage 112 via a current source 114, and a source terminal of the transistor 108 is grounded via a current source 116. The integrator 104 includes an operational amplifier ("op-amp") 118 and a capacitor 120 coupled to an inverting input and an output of the op-amp 118. The op-amp 118 generates an output signal 122. A voltage of the output signal 122 is referred to as an output voltage $V_{OUT}$. A non-inverting input of the op-amp 118 receives a reference voltage $V_{REF}$. An electrical interconnection 124 couples an output of the driver circuit 102 and the inverting input of the op-amp 118. A voltage on the interconnection 124 is referred to as an interconnection voltage $V_{INT}$.

The interconnection voltage $V_{INT}$ may typically swing either to the power supply voltage 112 or to ground when an integration performed by the integrator 104 is complete. When another integration begins, there is typically a need to wait for the interconnection voltage $V_{INT}$ to swing close to the reference voltage $V_{REF}$ before any effective integration can occur. This period of time is referred to as "recovery time." The recovery time typically depends directly on the size of the capacitor 120 and the charge/discharge currents from the current sources 114-116. This recovery time often causes a propagation delay between the input signal 110 received by the driver circuit 102 and the corresponding output signal 122 produced by the integrator 104.

Figure 2:
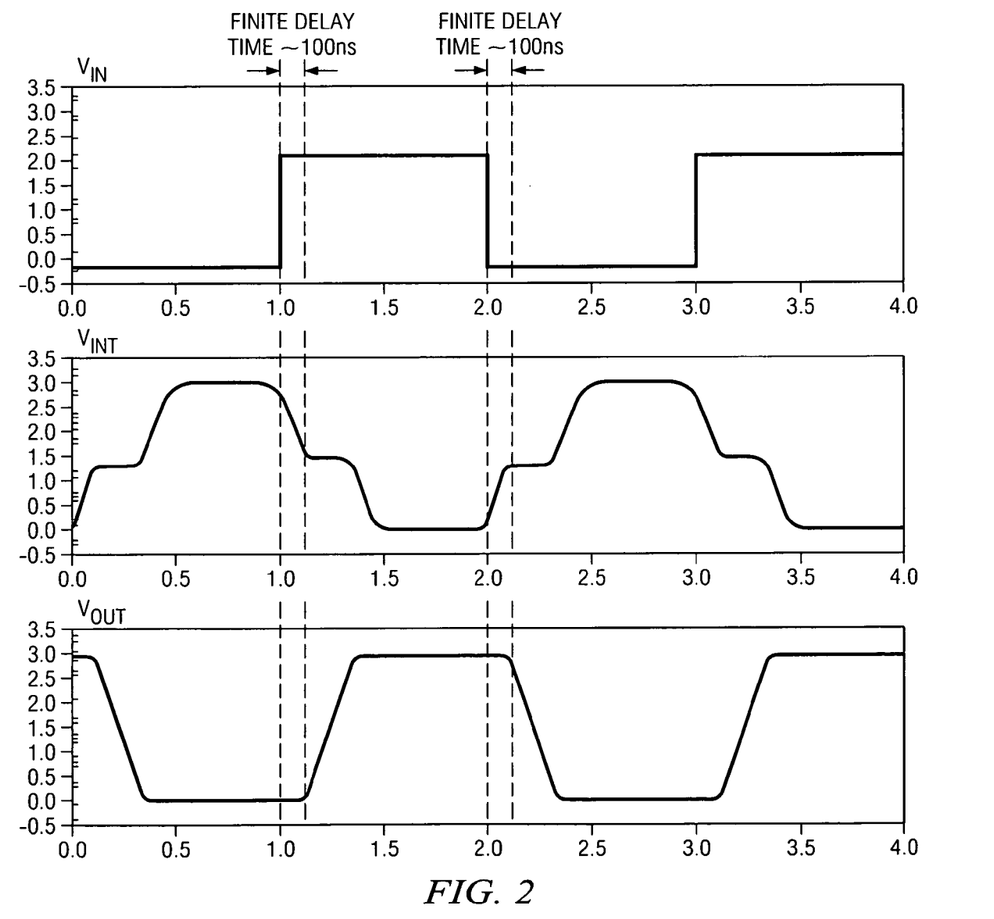
FIG. 2 illustrates simulation results of the conventional slew rate control circuit of FIG. 1.

FIG. 2 represents a circuit simulation that illustrates this delay between the input signal 110 and the output signal 122. The simulation involves the following parameters: the capacitor 120 has a capacitance of 2 pF, and the current sources 114-116 produce currents of 30 µA each. The main objective was to achieve a rise/fall time in the output signal 122 of 150 ns. As shown in FIG. 2, the delay time is approximately 100 ns. This amount of delay could be unreasonable or undesirable in certain circumstances.

Figure 3:
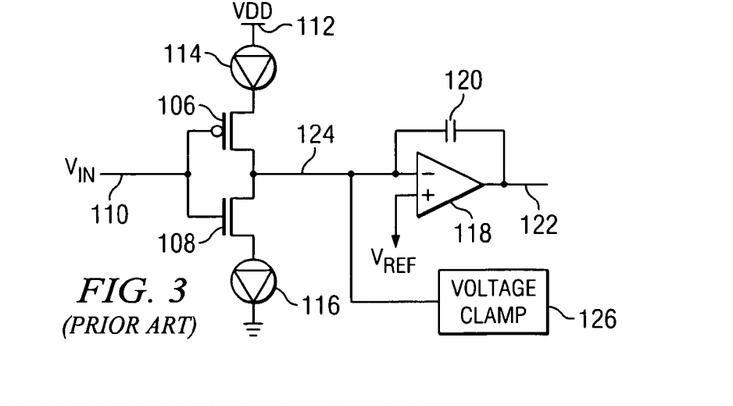
FIG. 3 illustrates a conventional integrator-based slew rate control circuit with a voltage clamp.
Figure 4:
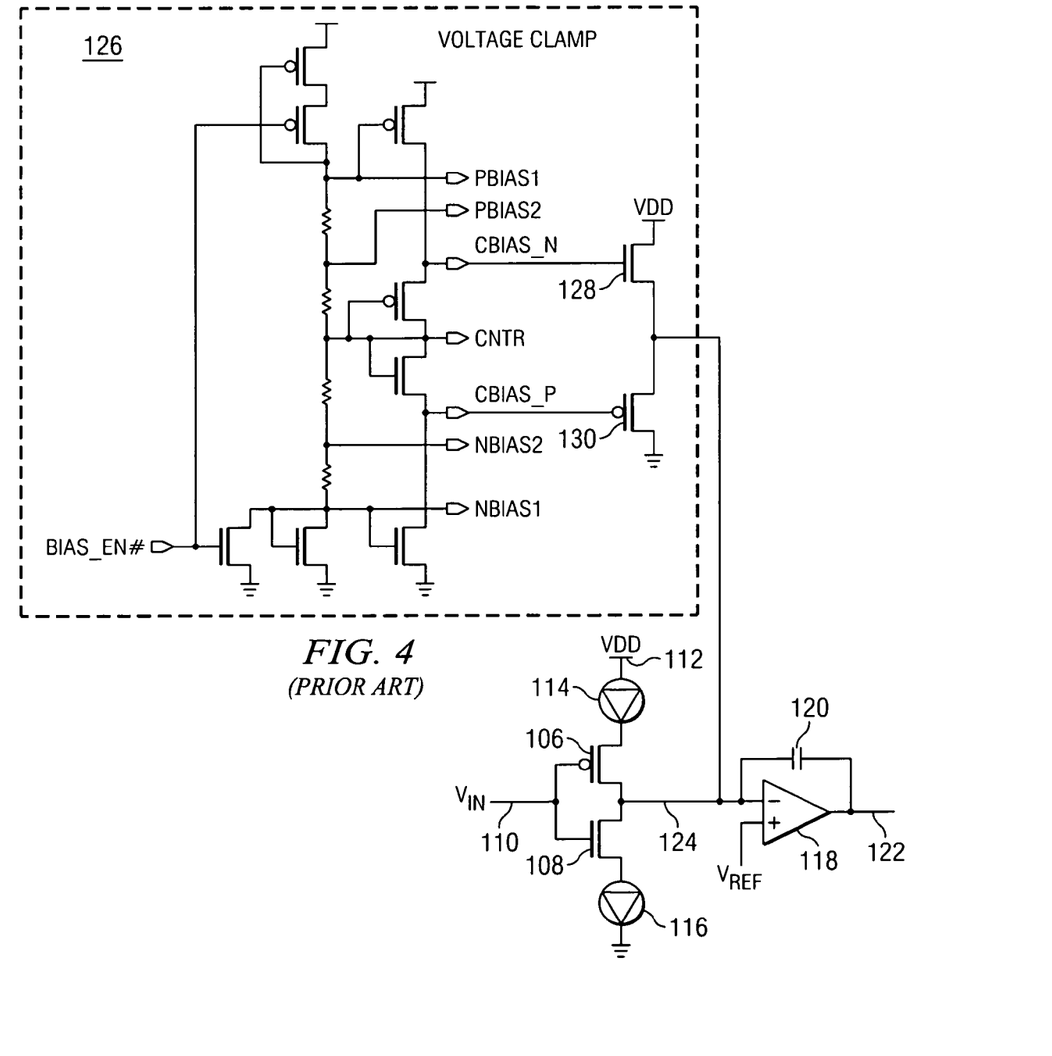
FIG. 4 illustrates a conventional voltage clamp in the slew rate control circuit of FIG. 3.

To reduce the recovery time of the integrator 104, one solution has been to limit the interconnection voltage $V_{INT}$ so that it is as close to the reference voltage $V_{REF}$ as possible while still being sufficient to force a level change in the output voltage $V_{OUT}$. This may reduce the signal swing on the interconnection 124. One technique to implement this solution has employed a voltage clamp 126 as shown in FIG. 3. FIG. 4 illustrates a previous implementation of the voltage clamp 126. As shown in FIG. 4, this implementation has two fixed biasing levels CBIAS_N and CBIAS_P. When the interconnection voltage $V_{INT}$ (124) is one threshold voltage below CBIAS_N, a transistor 128 turns on and limits the interconnection voltage $V_{INT}$ (124) from dropping further. When the interconnection voltage $V_{INT}$ (124) is one threshold voltage above CBIAS_P, a transistor 130 turns on and limits the interconnection voltage $V_{INT}$ (124) from rising further. However, this implementation typically has large variations in clamping levels due to process and temperature variations in the threshold voltage, resulting in a large variation in the recovery time.

SUMMARY

This disclosure provides circuits having precision voltage clamping levels and method.

In a first embodiment, a slew rate control circuit includes a receiver capable of receiving input signals and an output generator capable of generating output signals based on the input signals. The slew rate control circuit also includes an electrical interconnection coupling an output of the receiver and an input of the output generator. In addition, the slew rate control circuit includes a voltage clamp capable of clamping a voltage on the electrical interconnection between a first known voltage reference level and a second known voltage reference level.

In particular embodiments, the voltage clamp includes a driver circuit coupled to the electrical interconnection. The voltage clamp also includes a first current source capable of providing driving capacity to the driver circuit to prevent the voltage on the electrical interconnection from falling below one known voltage reference level. The voltage clamp further includes a second current source and a third current source capable of providing sinking capacity to the driver circuit to prevent the voltage on the electrical interconnection from rising above the other known voltage reference level.

In a second embodiment, an apparatus includes an interface capable of receiving input signals and a slew rate control circuit capable of producing output signals based on the input signals. The slew rate control circuit includes a receiver capable of receiving the input signals and an output generator capable of generating the output signals. The slew rate control circuit also includes an electrical interconnection coupling an output of the receiver and an input of the output generator. In addition, the slew rate control circuit includes a voltage clamp capable of clamping a voltage on the electrical interconnection between a first known voltage reference level and a second known voltage reference level.

In particular embodiments, the apparatus represents a smartcard.

In a third embodiment, a method includes receiving input signals at a receiver of a slew rate control circuit and generating output signals based on the input signals at an output generator of the slew rate control circuit. The method also includes clamping a voltage on an electrical interconnection coupling an output of the receiver and an input of the output generator. The voltage on the electrical interconnection is clamped between a first known voltage reference level and a second known voltage reference level.

In a fourth embodiment, a precision voltage clamp includes a driver circuit capable of being coupled to an electrical interconnection between a receiver capable of receiving input signals and an output generator capable of generating output signals based on the input signals. The driver circuit is also capable of preventing a voltage on the electrical interconnection from rising above a first known voltage reference level and from falling below a second known voltage reference level. The precision voltage clamp also includes a first current source capable of providing driving capacity to the driver circuit to prevent the voltage on the electrical interconnection from falling below the second known voltage reference level. The precision voltage clamp further includes a second current source and a third current source coupled to the second current source and to the driver circuit. The second and third current sources are capable of providing sinking capacity to the driver circuit to prevent the voltage on the electrical interconnection from rising above the first known voltage reference level.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 5 through 8, discussed below, and the various embodiments described in this disclosure are by way of illustration only and should not be construed in any way to limit the scope of the claimed invention. Those skilled in the art will understand that the principles described in this disclosure may be implemented in any suitably arranged device or system.

Figure 5:
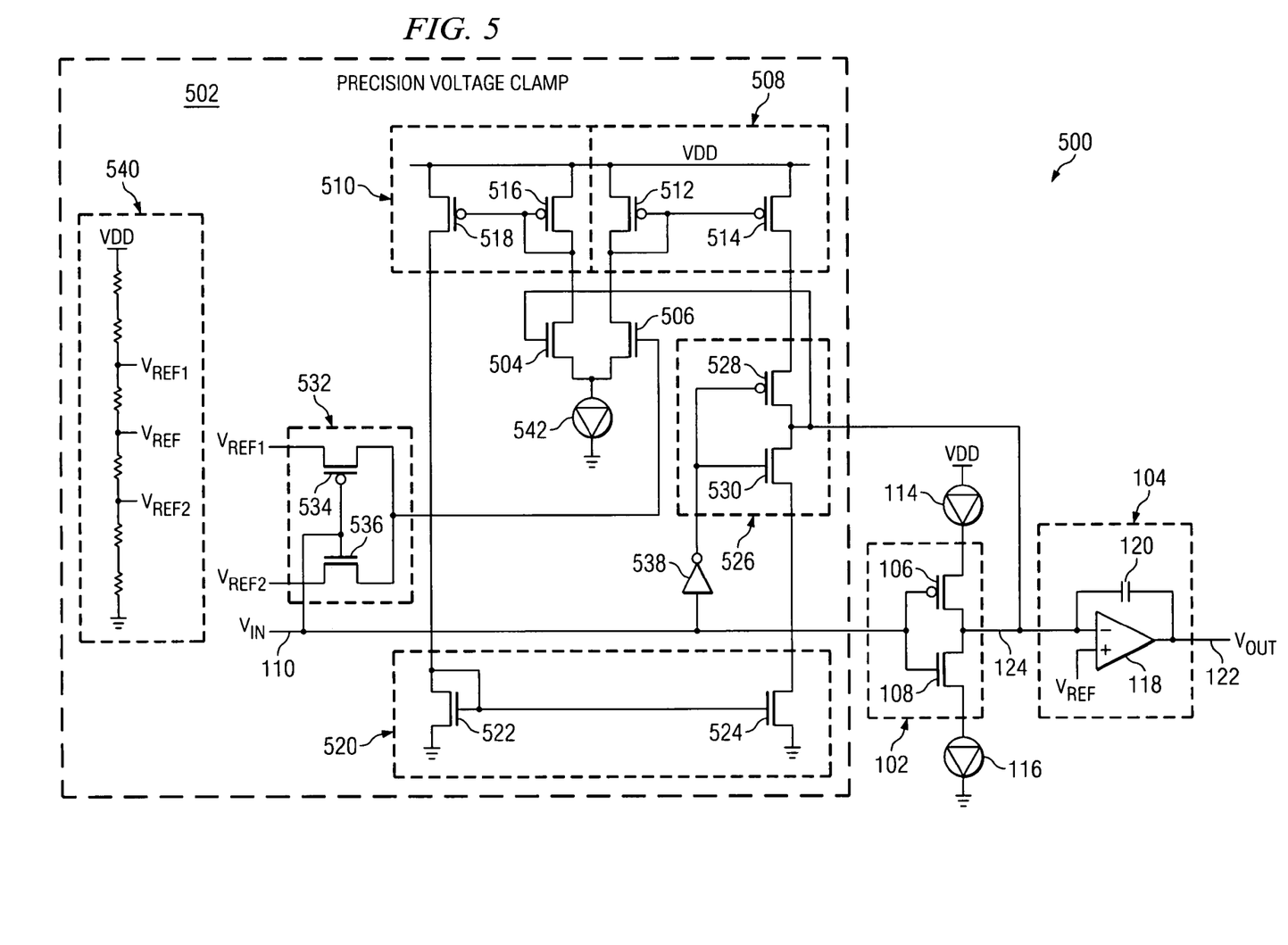
FIG. 5 illustrates an example integrator-based slew rate control circuit with a precision voltage clamp according to one embodiment of this disclosure.

FIG. 5 illustrates an example integrator-based slew rate control circuit 500 with a precision voltage clamp 502 according to one embodiment of this disclosure. The embodiment of the slew rate control circuit 500 and the embodiment of the precision voltage clamp 502 shown in FIG. 5 are for illustration only. Other embodiments of the slew rate control circuit and the precision voltage clamp could be used without departing from the scope of this disclosure.

As shown in FIG. 5, the slew rate control circuit 500 includes a receiver capable of receiving input signals (the driver circuit 102), an output generator capable of generating output signals (the integrator 104), and the precision voltage clamp 502. In this example, the precision voltage clamp 502 includes a pair of N-channel transistors 504-506 and two P-channel current mirrors 508-510 formed from P-channel transistors 512-514 and 516-518, respectively. The precision voltage clamp 502 also includes one N-channel current mirror 520 formed from N-channel transistors 522-524, a driver circuit 526 formed from transistors 528-530, and a driver circuit 532 formed from transistors 534-536. In addition, the precision voltage clamp 502 includes an inverter 538 and a resistor network 540.

The transistors 504-506 form an input differential pair circuit. The transistors 504-506 have source terminals coupled to a current source 542. A gate terminal of the transistor 504 is coupled to the interconnection 124, and a gate terminal of the transistor 506 is coupled to an output of the driver circuit 532. Drain terminals of the transistors 504-506 are coupled to the power supply voltage 112 through the P-channel current mirrors 508-510.

The transistors 512-514 form the P-channel current mirror 508. Source terminals of the transistors 512-514 are coupled to the power supply voltage 112. A drain terminal of the transistor 512 is coupled to the drain terminal of the transistor 506. A drain terminal of the transistor 514 is coupled to a drain terminal of the transistor 528 in the driver circuit 526.

The transistors 516-518 form the P-channel current mirror 510. Source terminals of the transistors 516-518 are coupled to the power supply voltage 112. A drain terminal of the transistor 516 is coupled to the drain terminal of the transistor 504. A drain terminal of the transistor 518 is coupled to a drain terminal of the transistor 522.

The transistors 522-524 form the N-channel current mirror 520. Source terminals of the transistors 522-524 are grounded. A drain terminal of the transistor 522 is coupled to the drain terminal of the transistor 518, and a drain terminal of the transistor 524 is coupled to a source terminal of the transistor 530.

The transistors 528-530 form the driver circuit 526. The transistors 528-530 represent pull-up and pull-down transistors, respectively. Gate terminals of the transistors 528-530 are coupled to the input signal 110 via the inverter 538. A drain terminal of the transistor 528 and a drain terminal of the transistor 530 are coupled to the interconnection 124. A source terminal of the transistor 528 is coupled to the source terminal of the transistor 514. A source terminal of the transistor 530 is coupled to the drain terminal of the transistor 524.

The transistors 534-536 form the driver circuit 532. The transistors 534-536 represent pull-up and pull-down transistors, respectively. The transistors 534-536 have gate terminals coupled to the input signal 110. A source terminal of the transistor 534 is coupled to a reference voltage $V_{REF1}$, and a source terminal of the transistor 536 is coupled to a reference voltage $V_{REF2}$. A drain terminal of the transistor 534 and a drain terminal of the transistor 536 are coupled to the gate terminal of the transistor 506.

The reference voltages $V_{REF}$, $V_{REF1}$, and $V_{REF2}$ are provided by the resistor network 540. In this example, the resistor network 540 represents a resistor ladder formed from multiple resistors. The resistor ladder acts as a voltage divider that generates the different reference voltages.

In one aspect of operation, the slew rate control circuit 500 may operate according to the following examples. In the following examples, a 3V input signal 110 is viewed as a high input logic level, and a 0V input signal 110 is viewed as a low input logic level.

In a first example, the initial state of the slew rate control circuit 500 is as follows: the input signal 110 is 0V, and the output signal 122 is 0V. Because the input signal 110 is 0V, the input to the driver circuit 532 is grounded. A grounded input to the driver circuit 532 turns on the transistor 534 and turns off the transistor 536. As a result, the output of the driver circuit 526 is pulled to the reference voltage $V_{REF1}$, which pulls the interconnection 124 to the reference voltage $V_{REF1}$.

When the input signal 110 changes from 0V to 3V, the interconnection 124 is pulled low by discharging through the transistor 108 with the current from the current source 116. As the voltage on the interconnection 124 is pulled close to the level of the reference voltage $V_{REF2}$, a negative feedback mechanism (formed by the transistors 504-506, 512-514, and 528) attempts to keep the voltage on the interconnection 124 very close to the reference voltage $V_{REF2}$. For this to occur, the driving current flowing out of the transistor 528 is more than the current from the current source 116. Hence, the current from the current source 542 is greater than n times the current from the current source 116, where n is greater than one. This may help to ensure that the transistor 528 has sufficient drive to prevent the interconnection 124 from being pulled further lower by the transistor 108.

In a second example, the initial state of the slew rate control circuit 500 is as follows: the input signal 110 is 3V, and the output signal 122 is 3V. Because the input signal 110 is 3V, the input to the driver circuit 532 is high. A high input to the driver circuit 532 turns on the transistor 536 and turns off the transistor 534. As a result, the output of the driver circuit 526 is pulled to the reference voltage $V_{REF2}$, which pulls the interconnection 124 to the reference voltage $V_{REF2}$.

When the input signal 110 changes from 3V to 0V, the interconnection 124 is pulled high by charging through the transistor 106 with the current from the current source 114. As the voltage on the interconnection 124 is pulled close to the level of the reference voltage $V_{REF1}$, a negative feedback mechanism (formed by the transistors 504-506, 516-518, 522-524, and 530) attempts to keep the voltage on the interconnection 124 very close to the reference voltage $V_{REF1}$. For this to occur, the driving current flowing into the transistor 530 is more than the current from the current source 114. Hence, the current from the current source 542 is greater than n times the current from the current source 114, where n is greater than one. This may help to ensure that the transistor 530 has sufficient sinking capacity to prevent the interconnection 124 from being pulled further higher by the transistor 106.

In this way, the voltage on the interconnection 124 may not swing to either the power supply voltage rail or the ground rail when integration is completed. Rather, the voltage on the interconnection 124 may remain clamped near the reference voltage $V_{REF}$, such as within a few hundred millivolts of the reference voltage $V_{REF}$. This reduces the time needed for the voltage on the interconnection 124 to swing close to the reference voltage $V_{REF}$ when integration starts. This may also effectively reduce the delay time between the input signal 110 and the corresponding output signal 122.

Figure 6:
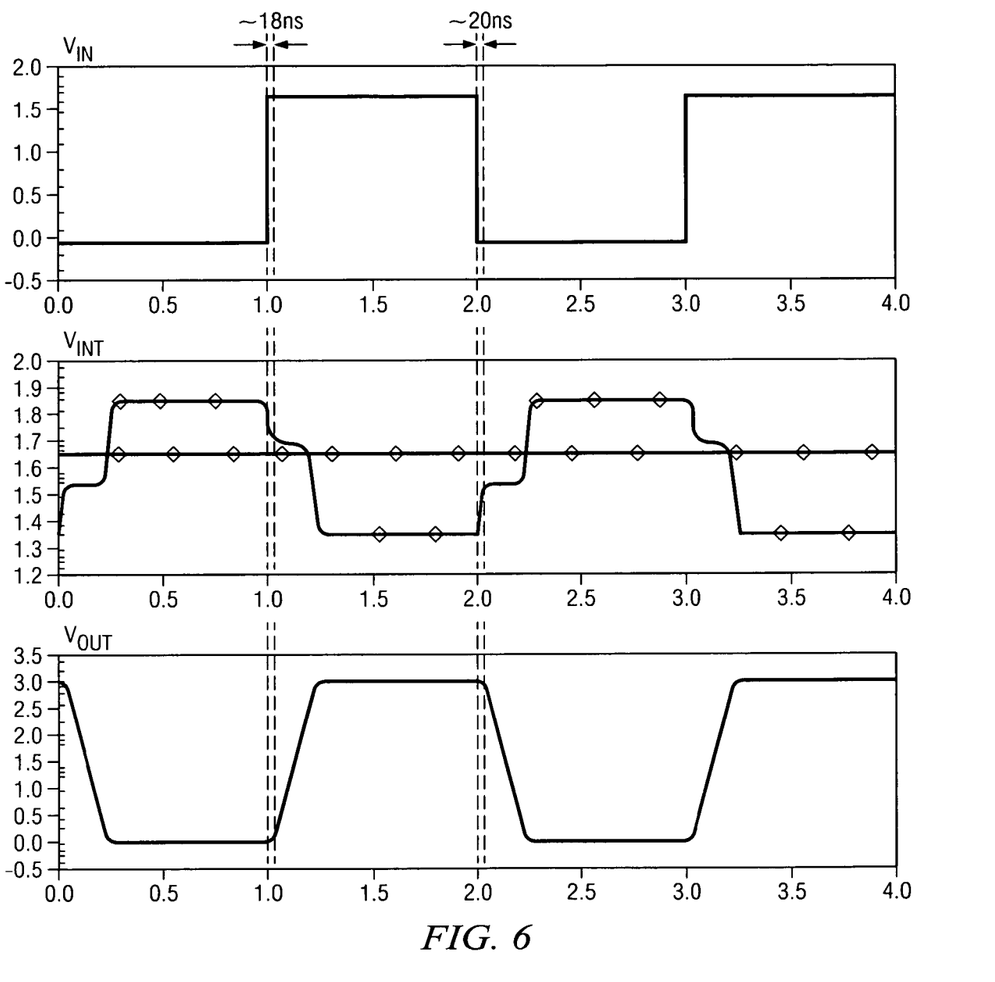
FIG. 6 illustrates simulation results of the slew rate control circuit of FIG. 5 according to one embodiment of this disclosure.

FIG. 6 illustrates simulation results of the slew rate control circuit 500 of FIG. 5 according to one embodiment of this disclosure. The simulation results shown in FIG. 6 are for illustration only. The slew rate control circuit 500 could operate in any other suitable manner without departing from the scope of this disclosure.

As shown in FIG. 6, there is a reduced or minimal delay time when the precision voltage clamp 502 is utilized in the slew rate control circuit 500. In some embodiments, the precision voltage clamp 502 may be based on precise matching of the resistor ratios in the resistor network 540 and the negative feedback mechanisms. Also, the power supply voltage 112 may be fixed (such as determined by, for example, a bandgap reference). In these embodiments, the clamping levels ($V_{REF1}$ and $V_{REF2}$) may be precisely determined, and variation of the recovery time may only be dependent on the precision of the charge/discharge currents from the current sources 114-116 and the integrating capacitor 120.

Figure 7:
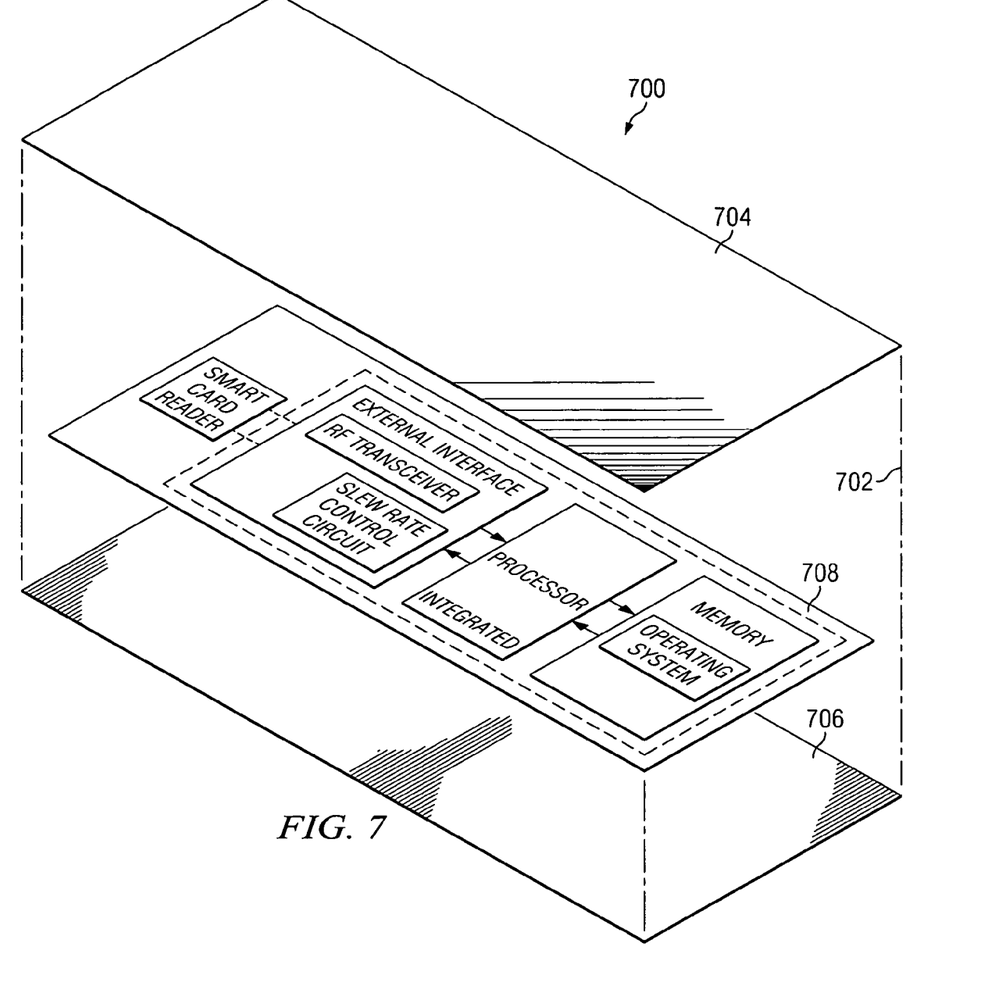
FIG. 7 illustrates an example smartcard incorporating the slew rate control circuit of FIG. 5 according to one embodiment of this disclosure.
Figure 8:
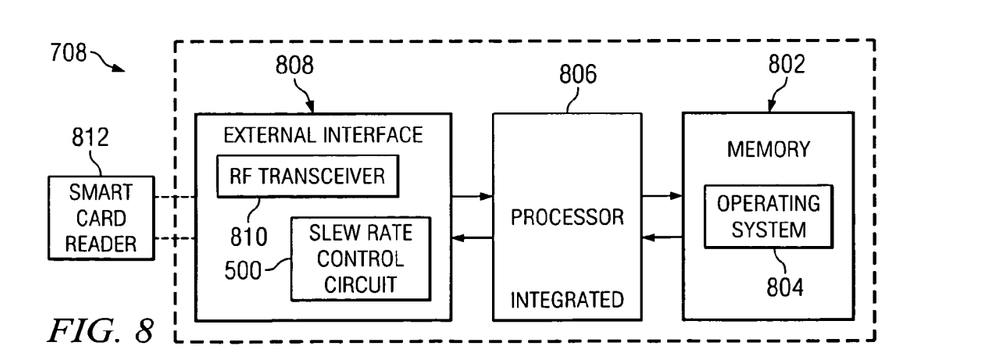
FIG. 8 illustrates additional details of the smartcard of FIG. 7 according to one embodiment of this disclosure.

The slew rate control circuit 500 of FIG. 5 may be employed in many different applications and products. One example use of the slew rate control circuit 500 is shown in FIGS. 7 and 8. However, the slew rate control circuit 500 could also be used in any other suitable application or product.

FIG. 7 illustrates an example smartcard 700 incorporating the slew rate control circuit 500 of FIG. 5 according to one embodiment of this disclosure. The embodiment of the smartcard 700 shown in FIG. 7 is for illustration only. Other embodiments of the smartcard 700 may be used without departing from the scope of this disclosure.

As shown in FIG. 7, the smartcard 700 includes a carrier 702 having a top insulating layer 704, a bottom insulating layer 706, and embedded electronic circuitry 708. The carrier 702 is capable of carrying or supporting the electronic circuitry 708 of the smartcard 700. For example, the carrier 702 could represent a plastic card or other structure for carrying a processor, operating system, and memory of the smartcard 700. The carrier 702 could have any suitable size or shape, such as a rectangular shape that is thin and small enough to fit inside a wallet like a credit card. As a particular example, the carrier 702 is approximately 3.375 inches long, approximately 2.2125 inches wide, and approximately 0.03 inches thick. Also, the carrier 702 could be formed from any suitable material or materials, such as plastic.

FIG. 8 illustrates additional details of the smartcard 700 of FIG. 7 according to one embodiment of this disclosure. In particular, FIG. 8 illustrates one possible embodiment of the electronic circuitry 708 of the smartcard 700. The embodiment of the electronic circuitry 708 shown in FIG. 8 is for illustration only. Other embodiments of the electronic circuitry could be used without departing from the scope of this disclosure.

As shown in FIG. 8, the electronic circuitry 708 includes a memory 802, an operating system 804 stored on the memory 802, and a processor 806 coupled to the memory 802. The electronic circuitry 708 also includes an external interface 808, which includes a radio frequency (RF) transceiver 810 and the slew rate control circuit 500 of FIG. 5.

The memory 802 represents any suitable storage and retrieval device or devices, including one or more volatile and/or non-volatile memories. The operating system 804 represents any suitable logic for controlling operation of the smartcard 700. The processor 806 represents any suitable processor or controller for executing instructions to control the operation of the smartcard 700. The external interface 808 includes any suitable structure for transmitting and/or receiving information, such as by transmitting information to and/or receiving information from a smartcard reader 812. The external interface 808 may, for example, receive incoming signals and provide data from the signals to the processor 806. The RF transceiver 810 includes any suitable structure for transmitting and/or receiving information using RF signals. In this example, the slew rate control circuit 500 may receive input signals from the RF transceiver 810 and provide output signals to the processor 806. Although shown as including the RF transceiver 810, the smartcard 700 could include any suitable wired or wireless interface for communicating with the smartcard reader 812 or other external component or system.

Although not shown, the smartcard 700 could include any other or additional electronic circuitry and perform any other or additional functions. For example, the smartcard 700 could include one or more co-processors for executing programs and performing complex arithmetic operations. Also, the smartcard 700 could generate and store private keys for use in cryptographic applications. The smartcard 700 could be used in any suitable application, such as placing telephone calls, making electronic cash payments, and securing information (by encrypting and decrypting messages). In addition, the smartcard 700 could be refreshed for additional use, such as when the smartcard 700 is used to place telephone calls and an amount of money associated with the smartcard 700 is depleted and then replenished.

Although FIGS. 5 through 8 illustrate one example of a slew rate control circuit 500 and a smartcard 700 using the slew rate control circuit 500, various changes may be made to FIGS. 5 through 8. For example, the slew rate control circuit 500 could include other logic that performs the same or similar functions as the logic shown in FIG. 5. As a particular example, the slew rate control circuit 500 may include other types of transistors and is not limited to use of P-channel and N-channel MOS transistors. Also, the simulation results shown in FIG. 6 represent one possible way in which the slew rate control circuit 500 could operate. The slew rate control circuit 500 could operate in any other suitable manner. Further, some or all of the electronic circuitry 708 in the smartcard 700 may be disposed on one or more surfaces of the smartcard 700 or otherwise be exposed externally. Beyond that, the smartcard 700 may have any suitable shape, such as the shape of an identification badge having an aperture through which a clip or other fastener may be removably attached to the smartcard 700. In addition, the smartcard 700 could include any other or additional electronic circuitry.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, or software, or a combination of at least two of the same. It should be noted that the functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A slew rate control circuit, comprising:
   a receiver capable of receiving input signals;
   an output generator capable of generating output signals based on the input signals;
   an electrical interconnection coupling an output of the receiver and an input of the output generator; and
   a voltage clamp capable of clamping a voltage on the electrical interconnection between a first known voltage reference level and a second known voltage reference level, the voltage clamp comprising,
      a driver circuit coupled to the electrical interconnection, the driver circuit capable of preventing the voltage on the electrical interconnection from rising above the first known voltage reference level and from falling below the second known voltage reference level,
      a first current source coupled to the driver circuit, the first current source capable of outputting driving current to the driver circuit to prevent the voltage on the electrical interconnection from falling below the second known voltage reference level, and,
      a second current source coupled to the driver circuit, the second current source capable of sinking current from the driver circuit to prevent the voltage on the electrical interconnection from rising above the first known voltage reference level.

2. The slew rate control circuit of claim 1, wherein the voltage clamp further comprises:
   a third current source coupled to the second current source, the third current source capable of determining a sinking capacity of the second current source to prevent the voltage on the electrical interconnection from rising above the first known voltage.

3. The slew rate control circuit of claim 2, wherein the driver circuit comprises a first driver circuit, and wherein the voltage clamp further comprises:
   a second driver circuit capable of outputting one of the two known voltage reference levels based on the input signals; and a differential pair circuit capable of receiving an output of the second driver circuit and an output of the first driver circuit, the differential pair circuit also capable of providing a first current to the first current source to provide the driving current to the first driver circuit, the differential pair circuit further capable of providing a second current to the third current source to determine the sinking capacity of the second current source for sinking current from the first driver circuit.

4. The slew rate control circuit of claim 3, wherein each of the first driver circuit and the second driver circuit comprises a pull-up transistor and a pull-down transistor.

5. The slew rate control circuit of claim 4, wherein:
each pull-up transistor comprises a P-channel transistor;
each pull-down transistor comprises an N-channel transistor; and
the differential pair circuit comprises two N-channel transistors.

6. The slew rate control circuit of claim 3, wherein:
the first current source comprises a first P-channel current mirror;
the second current source comprises a second P-channel current mirror; and
the third current source comprises an N-channel current mirror.

7. The slew rate control circuit of claim 3, wherein the voltage clamp further comprises:
a resistor ladder capable of producing the first and second known voltage reference levels.

8. The slew rate control circuit of claim 3, wherein:
the receiver comprises a third driver circuit; and
the output generator comprises an integrator, the integrator comprising an operational amplifier and a capacitor coupled between an output of the operational amplifier and an input of the operational amplifier.

9. An apparatus, comprising:
an interface capable of receiving input signals; and
a slew rate control circuit capable of producing output signals based on the input signals, wherein the slew rate control circuit comprises:
    a receiver capable of receiving the input signals;
    an output generator capable of generating the output signals;
    an electrical interconnection coupling an output of the receiver and an input of the output generator; and
    a voltage clamp capable of clamping a voltage on the electrical interconnection between a first known voltage reference level and a second known voltage reference level, the voltage clamp comprising,
        a driver circuit coupled to the electrical interconnection, the driver circuit capable of preventing the voltage on the electrical interconnection from rising above the first known voltage reference level and from falling below the second known voltage reference level,
        a first current source coupled to the driver circuit, the first current source capable of outputting driving current to the driver circuit to prevent the voltage on the electrical interconnection from falling below the second known voltage reference level, and,
        a second current source coupled to the driver circuit, the second current source capable of sinking current from the driver circuit to prevent the voltage on the electrical interconnection from rising above the first known voltage reference level.

10. The apparatus of claim 9, wherein the voltage clamp further comprises:

a third current source coupled to the second current source, the third current source capable of determining a sinking capacity of the second current source to prevent the voltage on the electrical interconnection from rising above the first known voltage.

11. The apparatus of claim 10, wherein the driver circuit comprises a first driver circuit, and wherein the voltage clamp further comprises:
a second driver circuit capable of outputting one of the two known voltage reference levels based on the input signals; and
a differential pair circuit capable of receiving an output of the second driver circuit and an output of the first driver circuit, the differential pair circuit also capable of providing a first current to the first current source to provide the driving current to the first driver circuit, the differential pair circuit further capable of providing a second current to the third current source to determine the sinking capacity of the second current source for sinking current from the first driver circuit.

12. The apparatus of claim 9, further comprising:
a processor capable of receiving and processing the output signals; and
a memory coupled to the processor.

13. The apparatus of claim 12, wherein the apparatus comprises a smartcard.

14. A method, comprising:
receiving input signals at a receiver of a slew rate control circuit;
generating output signals based on the input signals at an output generator of the slew rate control circuit;
clamping a voltage on an electrical interconnection coupling an output of the receiver and an input of the output generator between a first known voltage reference level and a second known voltage reference level;
preventing the voltage on the electrical interconnection from rising above the first known voltage reference level using a driver circuit by sinking current from the driver circuit using a second current source coupled to the driver circuit;
preventing the voltage on the electrical interconnection from falling below the second known voltage reference level using the driver circuit by outputting driving current to the driver circuit using a first current source coupled to the driver circuit.

15. The method of claim 14, further comprising:
providing a first current to the first current source to provide the driving current to the driver circuit; and
providing a second current to the second current source to sink current from the driver circuit.

16. A precision voltage clamp, comprising:
a driver circuit capable of being coupled to an electrical interconnection between a receiver capable of receiving input signals and an output generator capable of generating output signals based on the input signals, the driver circuit also capable of preventing a voltage on the electrical interconnection from rising above a first known voltage reference level and from falling below a second known voltage reference level;
a first current source capable of outputting driving current to the driver circuit to prevent the voltage on the electrical interconnection from falling below the second known voltage reference level; and
a second current source coupled to the driver circuit, the second current source capable of sinking current from the driver circuit to prevent the voltage on the electrical interconnection from rising above the first known voltage reference level.

17. The precision voltage clamp of claim 16, wherein the driver circuit comprises a first driver circuit, and further comprising:
   a second driver circuit capable of outputting one of the two known voltage reference levels based on the input signals; and
   a differential pair circuit capable of receiving an output of the second driver circuit and an output of the first driver circuit, the differential pair circuit also capable of providing a first current to the first current source to provide the driving current to the first driver circuit, the differential pair circuit further capable of providing a second current to a third current source coupled to the second current source to determine the sinking capacity of the second current source for sinking current from the first driver circuit.

* * * * *